(12) United States Patent
Rubinsztajn et al.

(10) Patent No.: US 8,048,819 B2
(45) Date of Patent: Nov. 1, 2011

(54) CURE CATALYST, COMPOSITION, ELECTRONIC DEVICE AND ASSOCIATED METHOD

(75) Inventors: Slawomir Rubinsztajn, Niskayuna, NY (US); John Robert Campbell, Clifton Park, NY (US); Ryan Christopher Mills, Rexford Park, NY (US); Sandeep Shrikant Tonapi, Niskayuna, NY (US); Ananth Prabhakumar, Clifton Park, NY (US)

(73) Assignee: Momentive Performance Materials Inc., Albany, NY (US)

( * ) Notice: Subject to any disclaimer, the term of this patent is extended or adjusted under 35 U.S.C. 154(b) by 920 days.

(21) Appl. No.: 11/167,847

(22) Filed: Jun. 23, 2005

(65) Prior Publication Data

US 2006/0293172 A1 Dec. 28, 2006

(51) Int. Cl.
*B01J 21/00* (2006.01)
*B01J 23/00* (2006.01)
*B01J 25/00* (2006.01)
*B01J 29/00* (2006.01)
*B01J 31/00* (2006.01)
*B01J 21/02* (2006.01)
*B01J 21/04* (2006.01)
*B01J 23/02* (2006.01)

(52) U.S. Cl. ........ 502/150; 502/100; 502/162; 502/167; 502/202; 502/439

(58) Field of Classification Search .............. 502/150, 502/100, 162, 167, 202, 439
See application file for complete search history.

(56) References Cited

U.S. PATENT DOCUMENTS

| | | | |
|---|---|---|---|
| 2,970,130 A | 1/1961 | Arnold | |
| 3,347,827 A | 10/1967 | Henry, Jr. | |
| 5,106,928 A | 4/1992 | Skoultchi et al. | |
| 5,280,119 A * | 1/1994 | Spielvogel et al. | 544/229 |
| 5,721,183 A * | 2/1998 | Neithamer | 502/103 |
| 6,462,156 B2 * | 10/2002 | LaPointe | 526/165 |
| 6,667,194 B1 | 12/2003 | Crane et al. | |
| 7,064,173 B2 | 6/2006 | Rubinsztajn et al. | |
| 7,241,851 B2 | 7/2007 | Cella et al. | |
| 2002/0010291 A1 * | 1/2002 | Murphy | 526/133 |
| 2003/0071368 A1 | 4/2003 | Rubinsztajn | |
| 2003/0096904 A1 * | 5/2003 | Hakuta et al. | 524/588 |
| 2003/0139287 A1 | 7/2003 | Deforth et al. | |
| 2003/0195370 A1 | 10/2003 | Taylor et al. | |
| 2004/0138343 A1 | 7/2004 | Campbell et al. | |

(Continued)

FOREIGN PATENT DOCUMENTS

EP 0291871 A2 11/1988

(Continued)

OTHER PUBLICATIONS

Kobayashi; "New Types of Lewis acids used in organic synthesis"; Pure & Appl. Chem., vol. 70, No. 5, pp. 1019-1026, 1998.*

(Continued)

*Primary Examiner* — James E McDonough
(74) *Attorney, Agent, or Firm* — Dominick G. Vicari

(57) ABSTRACT

A cure catalyst is provided. The cure catalyst may include a Lewis acid and one or both of a nitrogen-containing molecule or a non-tertiary phosphine. The nitrogen-containing molecule may include a mono amine or a heterocyclic aromatic organic compound. A curable composition may include the cure catalyst. An electronic device may include the curable composition. Methods associated with the foregoing are provided also.

8 Claims, 2 Drawing Sheets

U.S. PATENT DOCUMENTS

| | | |
|---|---|---|
| 2004/0155334 A1 | 8/2004 | Honda |
| 2005/0048700 A1 | 3/2005 | Rubinsztajn et al. |
| 2006/0011295 A1* | 1/2006 | Danielmeier et al. ..... 156/330.9 |
| 2006/0211836 A1 | 9/2006 | Rubinsztajn et al. |

FOREIGN PATENT DOCUMENTS

| | | |
|---|---|---|
| EP | 0 860 458 | 8/1998 |
| WO | WO 01/44311 | 6/2001 |
| WO | WO 0174938 A1 | 10/2001 |
| WO | WO 02/092665 | 11/2002 |
| WO | WO 2005/118682 A1 | 12/2005 |

OTHER PUBLICATIONS

U.S. Appl. No. 11/081,070, filed Mar. 15, 2005, entitled "Disproportionation of Hydridosiloxanes and Crosslinked Polysiloxane Network Derived Therefrom".

* cited by examiner

CURE CATALYST, COMPOSITION, ELECTRONIC DEVICE AND ASSOCIATED METHOD

BACKGROUND

The invention includes embodiments that relate to a curable composition and an associated method. The invention includes embodiments that relate to a device incorporating the composition.

Some electronic components may be connected by eutectic tin/lead (Sn/Pb) solder, which has a melting point at about 183 degrees Celsius (° C.). It may be desirable to use a lead-free solder rather than the eutectic solder. But, lead-free solder may have a different melting point than the eutectic solder. A possible replacement solder may have a melting point in range of from about 218 degrees Celsius to about 230 degrees Celsius. A higher melting point of the solder may shift peak temperature during a reflow from about 220 degrees Celsius to a new peak in a range of from about 240 degrees Celsius to about 260 degrees Celsius. Commercially available no-flow underfills (NUF) may respond to the higher temperature by initiating an overly fast cure that may restrict solder ball and prevent formation of good electrical connections.

Attempts to produce a catalytic material for an NUF for use with a lead-free solder have been problematic. Problems encountered may include an unacceptable electrical yield. It may be desirable to have a curable composition usable as an underfill material with lead-free solder having improved or different properties.

BRIEF DESCRIPTION

In one embodiment, the invention provides a cure catalyst. The cure catalyst may include a Lewis acid and one or both of a nitrogen-containing molecule or a non-tertiary phosphine, wherein the nitrogen-containing molecule may include a mono amine or a heterocyclic aromatic organic compound.

In one embodiment, the invention provides a composition that may include a first mixture or a second mixture. The first mixture may include a curable first resin and a first catalyst. The first catalyst may include a Lewis acid and one or both of a non-tertiary amine or a non-tertiary phosphine. The second mixture may include a curable organic second resin and a second catalyst. The second catalyst may include the Lewis acid and one or both of an amine or a phosphine. In one embodiment, the composition may include both the first and the second mixtures.

In one embodiment, the invention provides a film comprising a first mixture comprising a cured first resin and a first catalyst, the first catalyst comprising a Lewis acid and one or both of a non-tertiary amine or a non-tertiary phosphine; a second mixture comprising a curable organic second resin and a second catalyst, the second catalyst comprising the Lewis acid and one or both of an amine or a phosphine, or both the first and the second mixtures.

In one embodiment, the invention provides an electronic device. The device may include an electrical connection comprising lead-free solder and an underfill material. The underfill material may include a film, wherein the film may include a first mixture, a second mixture, or both the first and the second mixtures. The first mixture may include a cured first resin and a first catalyst. The first catalyst may include a Lewis acid and one or both of a non-tertiary amine or a non-tertiary phosphine. The second mixture may include a curable organic second resin and a second catalyst. The second catalyst may include the Lewis acid and one or both of an amine or a phosphine.

In one embodiment, the invention provides an electronic device. The device may include means for filling a region and an electrical connection. The region may be defined by an inward facing surface of a die and an inward facing surface of a substrate. The electrical connection may include a lead-free solder, and may secure the die to the substrate.

DETAILED DESCRIPTION

Figure 1:
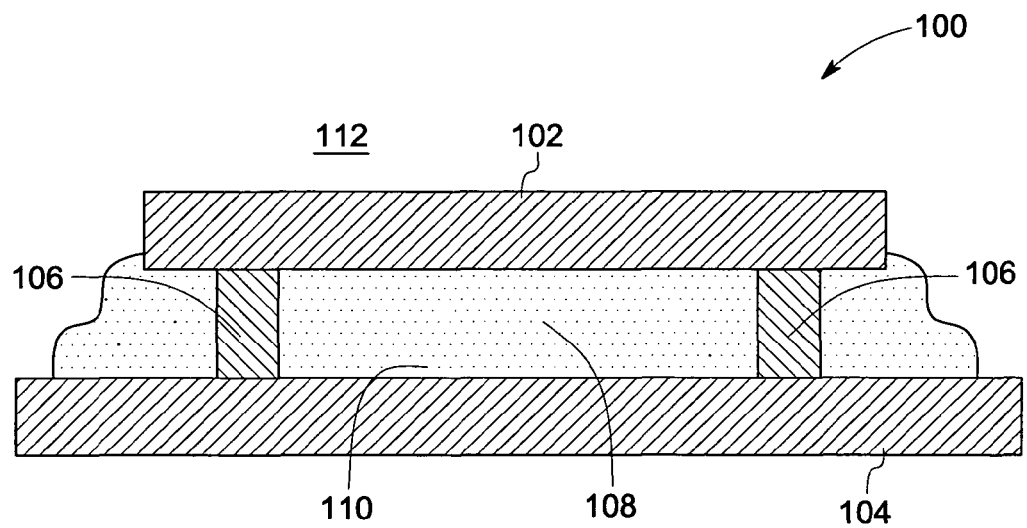
FIG. 1 is a schematic cross-sectional view of an electronic device comprising an embodiment of the invention.

The invention includes embodiments that relate to a catalyst for use with a curable composition. The invention includes embodiments that relate to a curable composition and an associated method. The invention includes embodiments that relate to a device incorporating the curable composition.

Approximating language, as used herein throughout the specification and claims, may be applied to modify any quantitative representation that could permissibly vary without resulting in a change in the basic function to which it is related. Accordingly, a value modified by a term or terms, such as "about" is not to be limited to the precise value specified. Catalyst refers to a crosslink initiating species that generally may not be incorporated into a polymer chain. Hardener refers to a crosslink initiating species that may be incorporated into a polymer chain.

Curable compositions, alternatively at times referred to as underfill compositions or underfill materials, according to at least some embodiments of the invention may have cure onset temperatures, or curing temperatures, which may correspond to the melt point, or melt point ranges, of lead-free solder. Suitable cure temperatures for use with lead-free solder may be in a range of greater than about 220 degrees Celsius, or in a range of from about 220 degrees Celsius to about 240 degrees Celsius, or from about 240 degrees Celsius to about 260 degrees Celsius.

Suitable lead-free solder may have a melt point in a range of from about 210 degrees Celsius to about 240 degrees Celsius. A commercially available lead-free solder may be obtained under the tradename ALPHA VACULOY SACX0307 from Cookson Electronics Assembly Materials (Jersey City, N.J.), and has a melt point of about 231.8 degrees Celsius. Another commercially available lead-free solder may be obtained under the tradename ENVIROMARK 907 from Kester Co. (Des Plaines, Ill.), and has a reflow temperature in a range of from about 180 degrees Celsius to about 240 degrees Celsius.

A suitable catalyst may include a Lewis acid, and the Lewis acid may form an adduct or a complex with one or both of a nitrogen-containing molecule or a non-tertiary phosphine. The nitrogen-containing molecule may include a mono amine or a heterocyclic aromatic organic compound.

Suitable Lewis acid catalysts may be described by the structure shown in Formula (I):

$$MR_bX_c \qquad (I)$$

wherein M is B, Al, Ga, In or Tl; each R may be independently the same or different from each other, and may represent a monovalent aromatic hydrocarbon radical having from about 6 to about 14 carbon atoms, such monovalent aromatic hydrocarbon radicals may have at least one electron-withdrawing element or group such as, for example, —$CF_3$, —$NO_2$ or —CN, or may be substituted with at least two halogen atoms, and b may be 1, 2, or 3; X may be a halogen atom, and c may be 0, 1 or 2; and with the proviso that b+c=3.

In one embodiment, the Lewis acid catalyst may be described by the structure shown in Formula (II):

$$BR_bXc \qquad (II)$$

wherein each R may be independently the same or different from each other, and may represent a monovalent aromatic hydrocarbon radical having from about 6 to about 14 carbon atoms, such monovalent aromatic hydrocarbon radicals preferably having at least one electron-withdrawing element or group, such as, for example, —$CF_3$, —$NO_2$ or —CN, or may be substituted with at least two halogen atoms, and b is 1, 2, or 3; X is a halogen atom, and c is 0, 1 or 2; and with the proviso that b+c=3.

In one embodiment, the Lewis acid may include a tri(aryl) borane adduct or complex with one or both of a nitrogen-containing molecule or a non-tertiary phosphine. The nitrogen-containing molecule may include a mono amine or a heterocyclic aromatic organic compound. In one embodiment, the Lewis acid may include one or more non-hydrolysable halogen.

Suitable aryl groups in the tri(aryl)borane composition may include one or more of pentafluorophenyl; 2,3,5,6-tetrafluorophenyl; 2,3,4,5-tetrafluorophenyl; 3,4,5-trifluorophen-1-yl; and 4-(pentafluorophenyl)-2,3,5,6-tetrafluorophenyl, and the like. The aryl groups may be the same or different from each other, and if different may be selected without reference to another pendant group. In one embodiment, the tri(aryl)borane is pentafluorophenyl borane [$B(C_6F_5)_3$], and the aryl component of the complex may consist essentially of pentafluorophenyl.

Suitable nitrogen-containing molecule comprises a mono amine or a heterocyclic aromatic organic compound, for example, aniline, pyridine, pyrimidine, pyrrole, pyrrolidine, indole, or aza compound. In one embodiment, the nitrogen-containing molecule or heterocyclic aromatic organic compound may include one or more of glycine, pentafluoroaniline, methyl-aniline, diethylenetriamine, diaminodiphenylamine, 1-methyl imidazole, 2-methyl imidazole, 1-phenyl imidazole, 1,8-diazabicyclo[5,4,0]undec-7-ene (DBU), 2-ethyl-4-methylimidazole, 2,4-dimethylimidazole, butylimidazole, 2-heptadecenyl-4-methylimidazole, 2-undecenylimidazole, 1-vinyl-2-methylimidazole, 2-n-heptadecylimidazole, 2-undecylimidazole, 2-heptadecylimidazole, 2-phenylimidazole, 2-ethyl 4-methylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazolearyl substituted imidazole, phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole, 1-benzyl-2-methylimidazole, 2-p-methoxystyrylimidazole, or 2-phenyl-4,5-dihydroxymethylimidazole. In one embodiment, the nitrogen-containing molecule or heterocyclic aromatic organic compound may include addition products of an imidazole and trimellitic acid. In one embodiment, the amine may consist essentially of an imidazole.

A suitable aza compound may include 1,4-diazabicyclo[2,2,2]octane, or the like. Another suitable nitrogen-containing molecule may have the structure shown below.

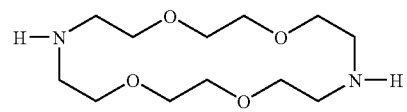

1,7,10,16-Tetraoxa-4,13-diazacyclooctadecane

Suitable phosphines may include one or more phosphorus-containing composition, for example, tributylphosphine, diphenyl butylphosphine, triphenylphosphine and the like. In one embodiment, the phosphines may include one or more non-tertiary phosphines. In one embodiment, the phosphine may consist essentially of one or more non-tertiary phosphines.

Adducts of the Lewis Acid and the amine composition and/or the phosphine composition may be prepared by combining the compounds in an inert diluent such as an aliphatic or aromatic hydrocarbon. An excess of either reactant may be employed; however, the two reactants may be combined in a molar ratio in a range of from about 0.5:1 to about 0.95:1, from about 1:0.95 to about 1:1, from about 1:1 to about 1:5, or greater than about 1:5. The reaction may be conducted at room temperature, or at a temperature in a range of from about minus 78 degrees Celsius to about plus 150 degrees Celsius. The final adduct may be isolated by filtration or solvent evaporation.

A suitable amount of the cure catalyst may be less than about 5 weight percent (wt. %) based on the total weight of the composition. In one embodiment, the cure catalyst may be in a range of from about 0.001 weight percent to about 0.01 weight percent, from about 0.01 weight percent to about 0.1 weight percent, or from about 0.1 weight percent to about 1 weight percent based on the total weight of the composition. In one embodiment, the cure catalyst may be based on the amount of resin and hardener in the composition rather than the total weight, which may include filler weight. In such an embodiment, the cure catalyst may be in an amount in a range of less than about 0.1 weight percent, in a range of from about 0.1 weight percent to about 0.3 weight percent, from about 0.3 weight percent to about 0.1 weight percent, or greater than about 0.1 weight percent based on the weight of the resin and hardener.

In one embodiment, a curable composition, such as an underfill material, may include the cure catalyst mixed with a curable resin, such as a curable organic resin or a curable inorganic resin (e.g., polysiloxane). Organic resins may include oxygen, heteroatoms, and the like, provided that the polymer backbone may be characterized as organic. In one embodiment, the curable organic resin may include an epoxy resin.

Suitable epoxy resins may include one or more aliphatic epoxy resins, cycloaliphatic epoxy resins, or aromatic epoxy resins. Suitable aliphatic epoxy resins may include one or more of butadiene dioxide, dimethyl pentane dioxide, diglycidyl ether, 1,4-butanediol diglycidyl ether, diethylene glycol diglycidyl ether, and dipentene dioxide, and the like. In one embodiment, an aliphatic epoxy monomer may include one or more of 1,4-butanediol diglycidyl ether, diethylene glycol diglycidyl ether, or dipentene dioxide diglycidyl ether, and the like.

Suitable cycloaliphatic epoxy resins may include one or more of 3-cyclohexenyl methyl-3-cyclohexenyl carboxylate diepoxide; 2-(3,4-epoxy)cyclohexyl-5,5-(3,4-epoxy)cyclohexane-m-dioxane; 3,4-epoxy cyclohexyl alkyl-3,4-epoxy cyclohexane carboxylate; 3,4-epoxy-6-methyl cyclohexyl methyl-3,4-epoxy-6-methyl cyclo hexane carboxylate; vinyl cyclohexane dioxide; bis(3,4-epoxy cyclohexyl methyl)adipate; bis(3,4-epoxy-6-methyl cyclohexyl methyl)adipate; bis (2,3-epoxy cyclopentyl)ether; 2,2-bis(4-(2,3-epoxy propoxy)cyclohexyl)propane; 2,6-bis(2,3-epoxy propoxy cyclohexyl-p-dioxane); 2,6-bis (2,3-epoxy propoxy)norbornene; diglycidyl ether of linoleic acid dimer; limonene dioxide; 2,2-bis(3,4-epoxy cyclohexyl)propane; dicyclopentadiene dioxide; 1,2-epoxy-6-(2,3-epoxy propoxy)hexahydro-4,7-methanoindane; p-(2,3-epoxy)cyclopentyl phenyl-2,3-epoxypropyl ether; 1-(2,3-epoxy propoxy)phenyl-5,6-epoxy hexahydro-4,7-methanoindane; (2,3-epoxy) cyclopentyl phenyl-2,3-epoxy propyl ether); 1,2-bis(5-(1,2-epoxy)-4,7-hexahydro methano indanoxyl)ethane; cyclopentenyl phenyl glycidyl ether; cyclohexane diol diglycidyl ether; diglycidyl hexahydrophthalate; and 3-cyclohexenyl methyl-3-cyclohexenyl carboxylate diepoxide; and the like. In one embodiment, a cycloaliphatic epoxy monomer may include one or more 3-cyclohexenyl methyl-3-cyclohexenyl carboxylate diepoxide, 3-(1,2-epoxy ethyl)-7-oxabicycloheptane; hexanedioic acid, bis(7-oxabicyclo heptyl methyl)ester; 2-(7-oxabicyclohept-3-yl)-spiro-(1,3-dioxa-5, 3'-(7)-oxabicyclo heptane; and methyl 3,4-epoxy cyclohexane carboxylate, and the like.

Suitable aromatic epoxy resins may include one or more of bisphenol-A epoxy resins, bisphenol-F epoxy resins, phenol novolac epoxy resins, cresol-novolac epoxy resins, biphenol epoxy resins, biphenyl epoxy resins, 4,4'-biphenyl epoxy resins, polyfunctional epoxy resins, divinylbenzene dioxide, resorcinol diglyciyl ether, and 2-glycidyl phenyl glycidyl ether.

The resin content according to an embodiment of the invention may be used as the basis for amounts of other ingredients. A suitable resin content, if present, may be greater than about 1 weight percent. In one embodiment, the resin content may be in a range of from about 1 to about 5 weight percent, from about 5 to about 10 weight percent, from about 10 weight percent to about 15 weight percent, from about 15 weight percent to about 25 weight percent, from about 25 weight percent to about 50 weight percent, from about 50 weight percent to about 75 weight percent, from about 75 weight percent to about 85 weight percent, from about 85 weight percent to about 95 weight percent, or greater than about 95 weight percent. The amount of resin may be adjusted, selected, or determined based on such factors as the molar amount of other ingredients and application specific parameters.

A suitable hardener may include an anhydride, such as carboxylic acid anhydride. Suitable carboxylic acid anhydrides may include one or more aromatic anhydride, aliphatic anhydride, or cycloaliphatic anhydride, and may have a relatively low melt point (below about 100 degrees Celsius) or may be liquid at about room temperature.

Suitable carboxylic acid anhydrides may be prepared by reacting a carboxylic acid with an acyl halide, or by dehydrating a carboxylic acid, that is, eliminate water between two carboxylic acid molecules to form the anhydride. Alternatively, carboxylic acid anhydrides may be obtained commercially from common chemical suppliers. Suitable carboxylic acid anhydrides may include one or more aromatic carboxylic acid anhydride, aliphatic carboxylic acid anhydride, or cycloaliphatic carboxylic acid anhydride.

In one embodiment, the anhydride may include one or more of methylhexahydrophthalic anhydride (MHHPA); methyltetrahydrophthalic anhydride; 1,2-cyclohexane dicarboxylic anhydride; bicyclo[2.2.1]hept-5-ene-2,3-dicarboxylic anhydride; methyl bicyclo[2.2.1]hept-5-ene-2,3-dicarboxylic anhydride; phthalic anhydride; pyromellitic dianhydride; hexahydro phthalic anhydride; dodecenyl succinic anhydride; dichloro maleic anhydride; chlorendic anhydride; tetrachlorophthalic anhydride; dodecenyl succinic anhydride; 2,2-dimethyl glutaric anhydride; glutaric anhydride; hexafluoro glutaric acid anhydride; itaconic anhydride; tetrapropenylsuccinic anhydride; maleic anhydride; 2-methyl glutaric anhydride; 2-methyl propionic anhydride 1,2-cyclohexane dicarboxylic anhydride; octadecyl succinic anhydride; 2- or n-octenyl succinic anhydride; 2-phenylglutaric anhydride; propionic acid anhydride; 3,3-tetramethylene glutaric anhydride; and the like.

The hardener, if used, may be present in an amount in a range of from about 0.1 weight percent to about 0.5 by weight percent, from about 0.5 to about 1 weight percent, from about 1 to about 3 weight percent, from about 3 to about 5 weight percent, from about 5 weight percent to about 10 weight percent, from about 10 weight percent to about 15 weight percent, from about 15 weight percent to about 25 weight percent, from about 25 weight percent to about 50 weight percent, or greater than about 50 weight percent, based on the weight of the total resin content.

Optional additives may be employed. Suitable additives may include one or more flexibilizer, carbinol, toughener, flow modifier, surfactant, wetting agent, antifoaming agent, organic diluent, fire retardant, or pigment. Additives, if used, may be present in an amount greater than about 0.5 weight percent based on the total weight of the composition. In one embodiment, the additive may be present in an amount in a range of from about 0.5 weight percent to about 1 weight percent, from about 1 weight percent to about 1.5 weight percent, from about 1.5 weight percent to about 2.5 weight percent, from about 2.5 weight percent to about 3.5 weight percent, from about 3.5 weight percent to about 4.5 weight percent, from about 4.5 weight percent to about 5.5 weight percent, from about 5.5 weight percent to about 10 weight percent, from about 10 weight percent to about 15 weight percent, from about 15 weight percent to about 20 weight percent, or greater than about 20 weight percent, based on the total weight of the resin.

In one embodiment, a curable or cured composition according to an embodiment of the invention may be free of polysulfide-based toughening agents. In one embodiment, a curable or cured composition according to an embodiment of the invention may be free of one or more of DBU-phenolate, DBU-hexanoate, DBU-formate, DBU-p-tonuenesulfonate, phenyl dimethyl urea, toluene bis dimethyl urea, or methylene diphenyl bis dimethyl urea.

In one embodiment, the additive may include nano-scale particles, such as silica particles having an average diameter that in a range of from about 1 nanometer to about 999 nanometers. The filler, such as the nano-scale silica particles, may be treated with a compatibilizing material, such as an organo silane. Further, treated filler may be passivated, for example, by treatment with a silazane, which may reduce or eliminate active termination sites on the particle surfaces, such as silanol groups.

In one embodiment, the additive may function as one or more of thermally conductive filler, electrically conductive filler, thermally insulative filler, electrically insulative filler, and the like. In one embodiment, the additive may be added to the resin side. In one embodiment, the additive may be added to the catalyst prior to mixture with the resin, or may be added during the time that the catalyst and the resin are mixed together.

A cure catalyst and/or a curable composition according to an embodiment of the invention may include a solvent. Suitable solvents may include one or more organic solvents, such as 1-methoxy-2-propanol, methoxy propanol acetate, butyl acetate, methoxyethyl ether, methanol, ethanol, isopropanol, ethyleneglycol, ethylcellosolve, methylethyl ketone, cyclohexanone, benzene, toluene, xylene, and cellosolves such as ethyl acetate, cellosolve acetate, butyl cellosolve acetate, carbitol acetate, and butyl carbitol acetate, and combinations thereof. These solvents may be used either singly or in the form of a combination of two or more.

Solvent may be present in a weight percent of greater than about 1 percent, based on the total weight of the curable composition. In one embodiment, the amount of solvent may be in a range of from about 1 weight percent to about 10 weight percent, from about 10 weight percent to about 25 weight percent, from about 25 weight percent to about 50 weight percent, or greater than about 50 weight percent based on the total weight of the curable composition.

A catalyzed resin or curable composition according to embodiments may have a stable and relatively long shelf life. Stability may be indicated by viscosity increase at a relatively low temperature, such as room temperature, over a predetermined time.

In one embodiment, a fluxing agent, such as a carboxylic acid, may be produced in situ during cure. An in situ formed flux may be the result of a reaction of, for example, an anhydride and a carbinol. In another embodiment, a flux may be liberated from a bound state in response to predetermined criteria, such as attaining a predetermined temperature. In an alternative embodiment, a flux may be added to the composition directly to eliminate a step, such as forming or liberating.

With reference to FIG. 1, an electronic device 100 comprising an embodiment of the invention is shown. The device 100 includes a die 102 secured to a substrate 104. One or more electrical connections 106 (two illustrated) formed from lead-free solder interconnect the die 102 and the substrate 104. A curable composition (underfill composition/material) 108 occupies at least a portion of a volume 110 defined by inward facing surfaces of the die 102 and the substrate 104. A region 112 is adjacent to an outward facing surface of the die 102, and may be occupied by an optional encapsulant material (not shown) such as a thermally conducting interfacial (TIM) material.

A method according to an embodiment of the invention may include disposing a curable, but uncured or only partially cured (e.g., B-staged), underfill material 108 into at least a portion of the volume 110. Subsequently, the underfill material may be cured. And, simultaneously with the curing of the underfill material 108, a lead-free solder ball may be heated to a melt point. In response, the lead-free solder ball may melt and flow to form one or more of the electrical interconnects 106. Accordingly, a cure temperature of the underfill, and the lead-free solder ball melt point, may be within predetermined parameters or respective ranges.

A method according to an embodiment of the invention may include disposing a curable, but as of yet uncured or only partially cured (e.g., B-staged), underfill material 108 into at least a portion of the volume 110. The underfill material may be cured. And, simultaneously with the curing of the underfill material 108, a lead-free solder ball may be heated to a melt point. In response, the lead-free solder ball may melt and flow to form one or more of the electrical interconnects 106. Accordingly, a cure temperature of the underfill material, and the lead-free solder ball melt point, may be within predetermined parameters or respective ranges.

In one embodiment, the temperature range for both the cure temperature and the melt temperature may be greater than about 150 degrees Celsius, in a range of from about 150 degrees Celsius to about 160 degrees Celsius, from about 160 degrees Celsius to about 170 degrees Celsius, from about 170 degrees Celsius to about 180 degrees Celsius, from about 180 degrees Celsius to about 190 degrees Celsius, from about 190 degrees Celsius to about 200 degrees Celsius, from about 200 degrees Celsius to about 210 degrees Celsius, from about 210 degrees Celsius to about 220 degrees Celsius, from about 220 degrees Celsius to about 230 degrees Celsius, from about 230 degrees Celsius to about 240 degrees Celsius, from about 240 degrees Celsius to about 250 degrees Celsius, or greater than about 250 degrees Celsius.

In one embodiment, a flux material may be selected, and incorporated into the underfill material, based on fluxing ability of the flux material at a predetermined temperature. The predetermined temperature may be selected to be within the predetermined parameters or respective ranges of the cure temperature of the underfill and/or the lead-free solder ball melt point. Suitable flux materials may include one or more anhydride and one or more carbinol disclosed herein. The flux material may increase electrical interconnectivity in an electrical connection.

EXAMPLES

The following examples are intended to illustrate methods and embodiments in accordance with the invention, and as such should not be construed as imposing limitations upon the claims. Unless specified otherwise, all ingredients are commercially available from such common chemical suppliers as Aldrich Chemical Company (Milwaukee, Wis.), Air Products (Allentown, Pa.), GE Silicones (Wilton, Conn.), Resolution Performance Products (Pueblo, Colo.), Dainippon Ink and Chemicals Inc., (Tokyo, Japan), and the like.

Example 1

Preparation of a Catalyst

A round bottom 100 milliliters (ml) flask is charged with 5 grams (g) of tris(pentafluorophenyl)borane and 15 ml of anhydrous toluene to form a suspension. The resultant suspension is stirred for 5 minutes at room temperature (25 degrees Celsius) to form a reaction mixture. Subsequently, 0.81 g of n-methylimidazole in 5 ml of anhydrous toluene is added drop-wise to the reaction mixture. The reaction mixture is transparent after the complete addition of n-methylimidazole. The reaction mixture is stirred at room temperature for an additional hour. Formation of white solids is observed after about 5 minutes of stirring. Subsequently, 30 ml of hexane is added to the reaction mixture and the flask is left in the refrigerator overnight. The next day, the white solid is filtered and dried under vacuum to yield 4.33 g of a product complex. The structure of the complex is confirmed by $^1$H, $^{13}$C and $^{19}$F NMR.

Example 2

Preparation of a Curable Composition

A first resin (RSL-1739) and a second resin (EXA-4700), both epoxy-based, are blended together at room temperature with 4-methyl-hexahydrophthalic anhydride (MHHPA), glycerol and 5,5'-(1,1,3,3,5,-hexamethyl-1,5-trisiloxane diyl)bis[hexahydro-4,7-methanoisobenzofuran-1,3-dione] (TriSNBA) to form a mixture. The resulting mixture is blended for 30 minutes at room temperature. A catalyst (POLYCAT SA-1 or a catalyst according to an embodiment of the invention) and optional additives as set forth in the Tables below are added to the mixture to produce a formulation. The formulation is mixed at room temperature for approximately 30 minutes and is degassed at room temperature for at least 30 minutes to form a curable composition. The resultant curable compositions are stored at minus 40 degrees Celsius.

Heat of reaction, onset of cure, cure peak temperature and glass transition temperature (Tg) are determined by non-isothermal DSC experiments performed with Differential Scanning Calorimeter (DSC) TA Instruments Q1000 system. Differential Scanning Calorimetery (DSC) is used to control curing kinetics of the curable composition. Approximately 10 milligrams (mg) of each curable composition is sealed in an individual aluminum hermetically sealable pan. Each sample and pan is heated at a rate of 30 degrees Celsius/minute from room temperature to 300 degrees Celsius and then cooled. The heat flow during the curing is recorded. The glass transition temperature is determined based on the second heating cycle of the same curable composition.

Determination of Fluxing Capability:

The solder fluxing test is performed using cleaned copper-laminated FR-4 board. A portion (0.2 g) of the curable composition is dispensed on the copper laminate and few lead free solder balls are placed inside the drop. Subsequently, the drop is covered with glass slide and the copper plate is passed through a reflow oven at a peak temperature of 260 degrees Celsius. The solder balls spread and coalescence is examined under optical microscope.

Procedure for Assembly and Testing:

Standard FR-4 and high Tg/low CTE FR-4 boards are used for assembly and have electrolytic nickel with a gold flash layer surface finish. The bond pads on both test boards are defined by a rectangular trench etched out of the solder mask (Taiyo/PSR 4000). A controlled amount of curable composition is dispensed using a 22-gauge needle (EFD Inc) in a dot/line pattern in the center of the component footprint area to test boards previously baked out at temperatures ranging from 150 degrees to 220 Celsius for a time ranging from 20 minutes up to 2 hours. The flip chip die is placed using an MRSI 505 automatic pick and place machine with a placement force of 150 grams and placement head dwell time of 500 milliseconds. Reflow of these test vehicles is carried out using a ZEPHER convection reflow oven using a lead free profile with a soak zone and peak temperature in a range of from about 250 degrees Celsius to about 260 degrees Celsius. A post cure step of 1 hour at 160 degrees Celsius after reflow is necessary to complete the curing step. The assembled flip-chip is subjected to Air-to-Air Thermal Shock (AATS) (minus 55 degrees Celsius to plus 150 degrees Celsius) for 1000 cycles (dwell time: 10 minutes at each extreme). The curable compositions are monitored for cracking and for electrical continuity through thermal shock testing.

Example 3 Through Example 6 and Comparative Example 1

Catalyst Concentration with Regard to Cure Properties of Curable Compositions

In the Examples 3 through 6 and in Comparative Example 1, curable compositions are prepared in a similar manner as described in Example 2, using a single resin and with variations in the weight percent of a catalyst (as prepared in Example 1) added as indicated in Table 1 below.

TABLE 1

| Ingredients for Example 3-6 and Comparative Example 1 | | | | | |
|---|---|---|---|---|---|
| Ingredients | Comparative Example 1 | Example 3 | Example 4 | Example 5 | Example 6 |
| RSL1739 (g) | 3.0 | 3.0 | 3.0 | 3.0 | 3.0 |
| 20 wt % TriSNBA in MHHPA (g) | 2.72 | 2.72 | 2.72 | 2.72 | 2.72 |
| Ricon 130MA8 (g) | 0.50 | 0.50 | 0.50 | 0.50 | 0.50 |
| Gycerol (g) | 0.238 | 0.238 | 0.238 | 0.238 | 0.238 |
| Catalyst (wt %) | 0 | 0.1 | 0.2 | 0.4 | 0.6 |
| Catalyst from Example 1 (g) | 0.000 | 0.0065 | 0.0129 | 0.0258 | 0.0388 |

The following scale is used to rate the ability of the curable composition to flux and to evaluate the degree of cure of the curable composition.

A. Fluxing:
1. No change in the shape of solder balls
2. Solder starts to collapse
3. Solder balls are collapsed but do not coalesce.
4. Solder balls are collapsed and some coalescence is observed.
5. Solder balls are collapsed and complete coalescence is observed B. Degree of Cure:
1. Viscous fluid after reflow at room temperature
2. Low viscosity fluid after reflow at elevated temperature, and sticky solid at room temperature
3. Viscous fluid after reflow at elevated temperature, solid at room temperature
4. Soft after reflow at elevated temperature, solid at room temperature
5. Solid after reflow at elevated temperature

TABLE 2

Results of Example 3-6 and Comparative Example 1.

| Results | Comparative Example 1 | Example 3 | Example 4 | Example 5 | Example 6 |
|---|---|---|---|---|---|
| Fluxing Lead free | 5 | 5 | 5 | 5 | 5 |
| Degree of cure | 1 | 3 | 4 | 5 | 5 |
| DSC peak (° C.) | none | 260.2 | 255.4 | 252.7 | 248.4 |
| DSC H onset (° C.) | none | 227.6 | 223.7 | 221.7 | 218.2 |
| DSC H (J/g) | none | 172.8 | 189.6 | 232.0 | 235.4 |
| DSC Tg (° C.) | none | 66.8 | 80.95 | 98.4 | 100.6 |

A catalyst may be necessary for effective curing. The curable composition achieves minimal curing in the absence of a catalyst. Results tabulated in Table 2 demonstrate that in Example 3 though Example 6 the formulations have acceptable cure characteristics for use in a lead-free solder application.

Figure 2:
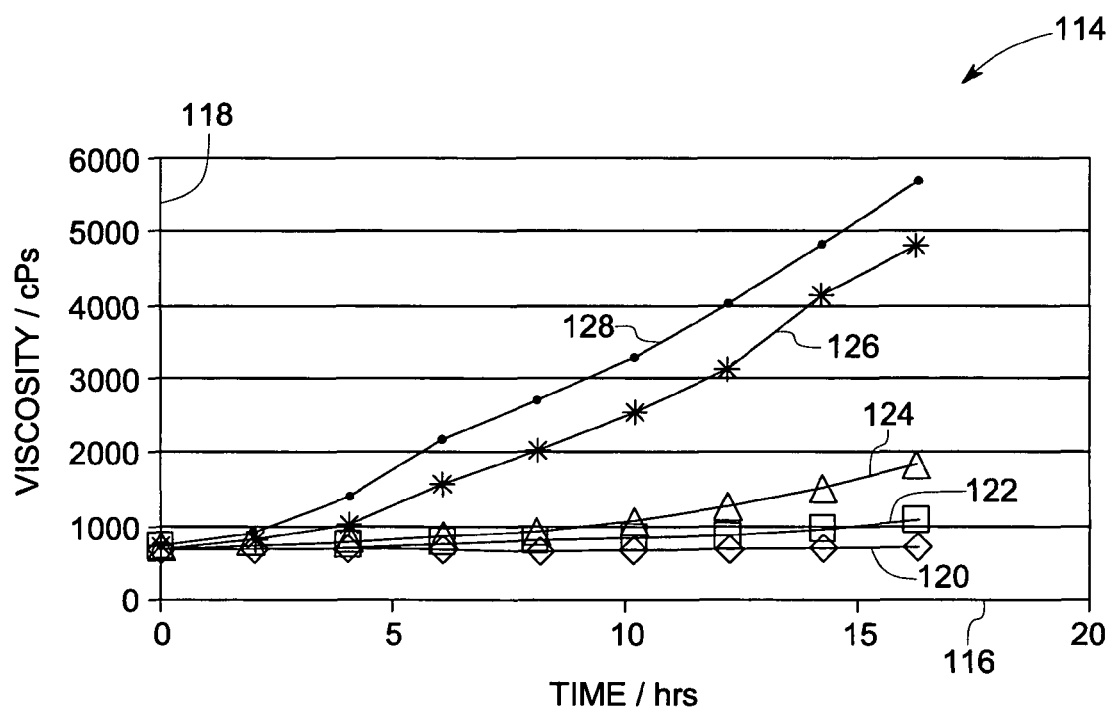
FIG. 2 is a graph of change in viscosity versus time.

FIG. 2 is a graph, represented by the reference number 114, showing five curve profiles of viscosity 118 (centipoise) versus time 116 (hours). Each of the five curve profiles corresponds to one of Examples 3-6 or to Comparative Example 1. The results indicate that with the increase in catalyst concentration, there is an increase in the viscosity of the curable composition over time at room temperature. In the absence of a catalyst, there is little or no increase in viscosity over time, as indicated by Curve 120. The larger the concentration of the catalyst, the greater the increase in viscosity over time, as indicated by Curves 122, 124, 126 and 128.

Example 7 and Comparative Example 2-6

Effect of Catalyst Concentration on Cure Properties

In Example 7 and Comparative Examples 2-6, curable compositions are prepared in a similar manner as described in Example 2, with variations in the weight percent of catalyst (POLYCAT SA-1) as indicated in Table 3. The ratio of EXR4700 to RSL1739 is 1 to 4.

TABLE 3

Ingredients for Example 7 and Comparative Example 2-6

| Ingredients | Comparative Example 2 | Comparative Example 3 | Comparative Example 4 | Comparative Example 5 | Comparative Example 6 | Example 7 |
|---|---|---|---|---|---|---|
| EXR4700/ RSL1739 (g) | 2.0 | 2.0 | 2.0 | 2.0 | 2.0 | 2.0 |
| MHHPA (g) | 1.82 | 1.82 | 1.82 | 1.82 | 1.82 | 1.82 |
| Gycerol (g) | 0.134 | 0.134 | 0.134 | 0.134 | 0.134 | 0.134 |
| POLYCAT SA-1 (wt %) | 0.02 | 0.01 | 0.002 | 0.001 | 0.000 | 0 |
| Catalyst of Example 1 (wt %) | 0 | 0 | 0 | 0 | 0 | 0.02 |

TABLE 4

Results for Example 7 and Comparative Examples 2-6.

| Results | Comparative Example 2 | Comparative Example 3 | Comparative Example 4 | Comparative Example 5 | Comparative Example 6 | Example 7 |
|---|---|---|---|---|---|---|
| Fluxing Lead-Free | 1 | 4 | 5 | 5 | 5 | 5 |
| Degree of cure | 5 | 5 | 3 | 1 | 1 | 5 |
| DSC peak (° C.) | 221.0 | 241 | 248 | 264 | not cured | 250.0 |
| DSC H onset (° C.) | 189.0 | 209 | 217 | 223 | ND | 221.0 |
| DSC H (J/g) | 326.0 | 317 | 310 | 232 | ND | 297.0 |
| DSC Tg (° C.) | 128.0 | 125 | 132 | 122 | ND | 121.0 |

The results in Table 4 indicate that Comparative Example 2 through Comparative Example 6 have acceptable cure characteristics for lead-free application within a relatively narrow range of catalyst concentration. The results indicate also that Comparative Example 2 through Comparative Example 6 require a relatively decreased catalyst quantity compared to Example 7.

Figure 3:
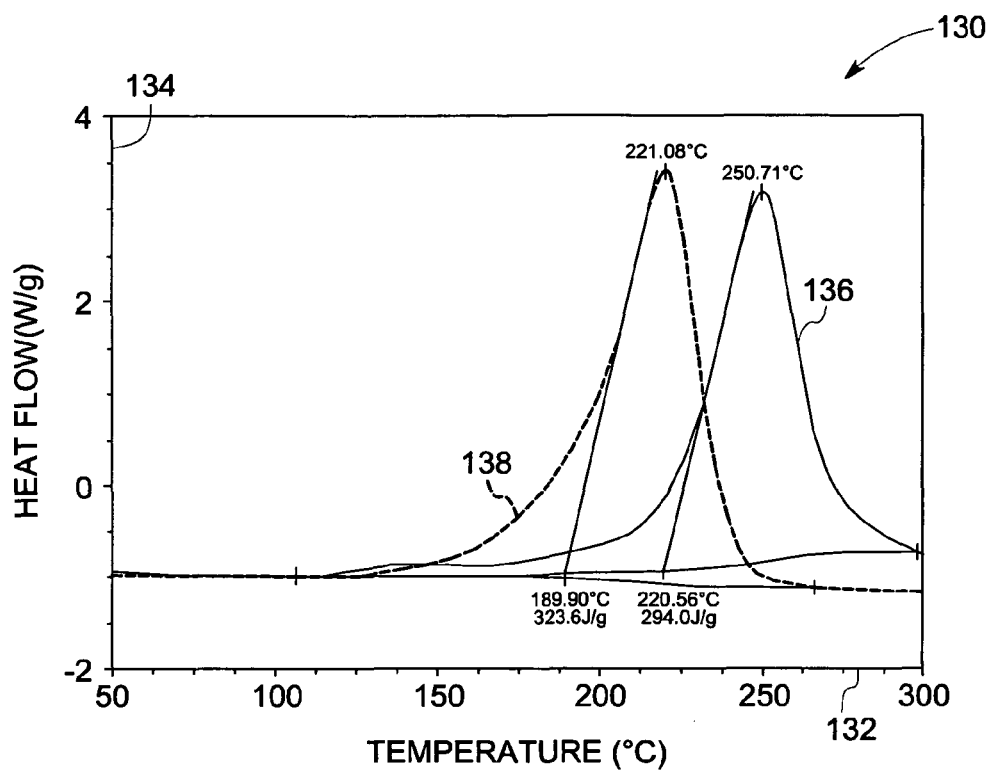
FIG. 3 is a graph of two cure profiles of heat flow versus temperature.

FIG. 3 is a graph, represented by reference number 130, showing two curve profiles of heat flow (W/g) 134 versus temperature (degrees Celsius) 132. The onset temperature or curing temperature profile of the curable composition of Example 7 is indicated as Curve 136. The onset temperature or curing temperature profile of the curable composition of Comparative Example 2 is indicated as Curve 138. The cure temperature of the curable composition of Example 7 may be about the same as a melt point temperature of a lead-free solder material. Further, the onset temperature or curing temperature of the curable composition of Example 7 may be about 30 degrees Celsius higher than the curable composition of Comparative Example 2, which is adapted for use with a lead-containing solder.

Example 8 and Comparative Example 7

Room Temperature Stability

In Example 8, the curable composition includes the catalyst of Example 1. Comparative Example 7 includes POLYCAT SA-1 as the catalyst. Example 8 and Comparative Example 7 include ingredients in the amounts shown in Table 5. Example 8 and Comparative Example 7 are prepared in a manner similar to that disclosed in Example 2.

TABLE 5

Ingredients for Example 8 and Comparative Example 7.

| Ingredients | Example 8 | Comparative Example 7 |
|---|---|---|
| EXR4700 (g) | 0.5 | 0.5 |
| RSL1739 (g) | 2.000 | 2.000 |
| MHHPA (g) | 2.269 | 2.269 |
| Glycerol (g) | 0.210 | 0.210 |
| Catalyst of Example 1 (wt %) | 0.6000 | 0 |
| POLYCAT SA-1 (wt %) | 0 | 0.0300 |

The samples are each analyzed through two temperature cycles. The first run captures the heat of cure. The second run provides a baseline for subtracting thermal events unrelated to the cure. Baseline files are subtracted from each run. Indium standards are analyzed to confirm temperature and heat flow calibration of the DSC prior to sample analysis. Indium calibration is within 0.5 degrees Celsius of the expected onset and within 0.2 Joules/gram (J/g) of the expected heat flow.

Figure 4:
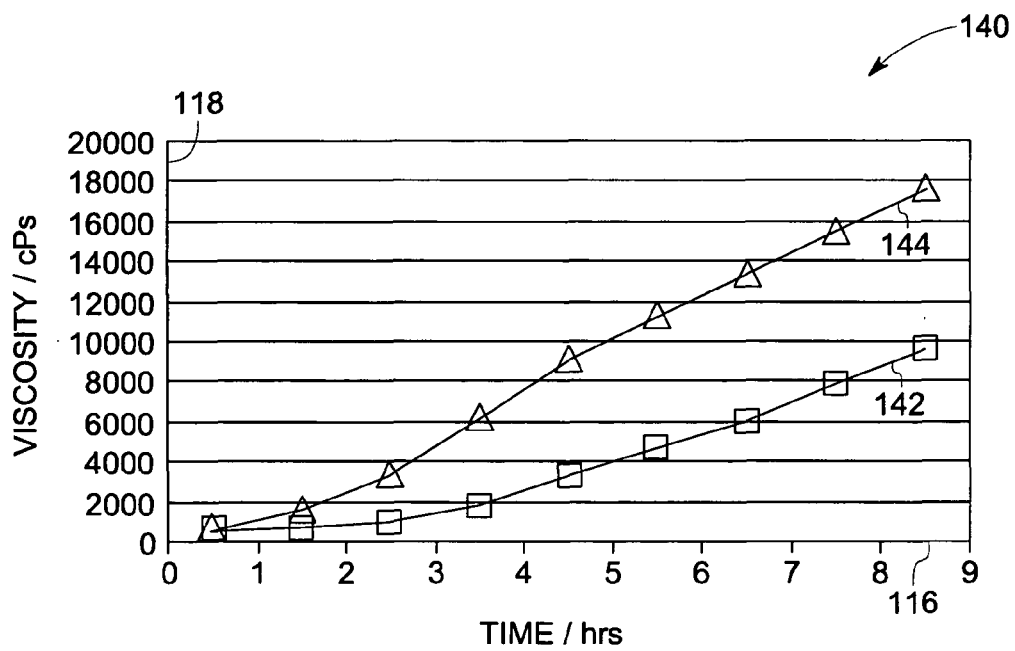
FIG. 4 is a graph of change in viscosity versus time.

FIG. 4 is a graph, represented by reference number 140, showing two curve profiles of viscosity 118 versus time 116 at room temperature. Curve 142 indicates the viscosity profile for Example 8, and Curve 144 indicates the viscosity profile for Comparative Example 7. Comparison of the Curves 142, 144 demonstrates a relatively greater viscosity increase over time of Comparative Example 7 compared to Example 8. That is, an embodiment according to the invention may have an improved or longer shelf life at room temperature compared to a commercially available material As shown in Table 6, and with reference to FIG. 4, the results indicate that a curable composition according to an embodiment of the invention has relatively lower viscosity after 8 hours storage at room temperature compared to material using a commercially available catalyst in an amount sufficient to achieve an acceptable cure. Further, to achieve desirable cure properties, Table 5 indicates the catalyst concentration in Comparative Example 7 is decreased relative to the catalyst concentration of Example 8. The catalyst concentration in Comparative Example 7 is sufficiently low to be relatively problematic in metering the catalyst in a require concentration range.

TABLE 6

Results for Example 8 and Comparative Example 7.

| Results | Example 8 | Comparative Example 7 |
|---|---|---|
| Fluxing Lead free | 5 | 5 |
| Degree of cure | 5 | 5 |

The foregoing examples are merely illustrative, serving to illustrate only some of the features of the invention. The appended claims are intended to claim the invention as broadly as it has been conceived. The examples herein presented are illustrative of selected embodiments from a manifold of all possible embodiments. Accordingly, it is Applicants' intention that the appended claims are not to be limited by the choice of examples utilized to illustrate features of the invention. As used in the claims, the word "comprises" and its grammatical variants logically also subtend and include phrases of varying and differing extent such as for example, "consisting essentially of" and "consisting of". Ranges have been supplied, the limits of which may be combined and/or interchanged, and those ranges are inclusive of all sub-ranges there between. It is to be expected that variations in these ranges will suggest themselves to a practitioner having ordinary skill in the art, and, where not already dedicated to the public, those variations should be construed to be covered by the appended claims. Advances in science and technology may make equivalents and substitutions possible that are not now contemplated by reason of the imprecision of language and these variations should also be construed to be covered by the appended claims.

The invention claimed is:

1. A cure catalyst, comprising a Lewis acid which comprises a tri(aryl)borane; and
    a nitrogen-containing molecule, wherein the nitrogen-containing molecule is one or more of 1-methyl imidazole, 2-methyl imidazole, 1-phenyl imidazole, 1,8-diazabicyclo[5,4,0]undec-7-ene (DBU), 2-ethyl-4-methylimidazole, 2,4-dimethylimidazole, butylimidazole, 2-heptadecenyl-4-methylimidazole, 2-undecenylimidazole, 1-vinyl-2-methylimidazole, 2-phenylimidazole, 2-ethyl 4-methylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazolearyl substituted imidazole, phenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole, 1-benzyl-2-methylimidazole, 2-p-methoxystyrylimidazole, 2-phenyl-4,5-dihydroxymethylimidazole, an addition product of imidazole and trimellitic acid, 1,4-diazabicyclo[2,2,2]octane, and 1,7,10,16-tetraoxa-4,1,3-diazacyclooctadecane.

2. The catalyst as defined in claim 1, wherein the Lewis acid is a complex or adduct of the nitrogen-containing molecule.

3. The catalyst as defined in claim 1, wherein the nitrogen-containing molecule comprises one or both of 1,8-diazabicyclo[5,4,0]undec-7-ene or methyl imidazole.

4. The catalyst as defined in claim 1, wherein the tri(aryl) borane comprises one or more of phenyl, pentafluorophenyl; 2,3,5,6-tetrafluorophenyl; 2,3,4,5-tetrafluorophenyl; 3,4,5-trifluorophen-1-yl; or 4-(pentafluorophenyl)-2,3,5,6-tetrafluorophenyl.

5. The catalyst as defined in claim 4, wherein the Lewis acid comprises one or more non-hydrolysable halogen.

6. The catalyst as defined in claim 1, wherein the Lewis acid has a structure as shown in Formula (I):

$$BR_3 \qquad (I);$$

wherein each R is independently at each occurrence a monovalent aromatic hydrocarbon radical having from about 6 to about 14 carbon atoms, optionally, the monovalent aromatic hydrocarbon radical has an electron-withdrawing element or group, or is substituted with at least two halogen atoms.

7. The cure catalyst of claim 1 wherein the Lewis acid and nitrogen-containing molecule components are each present in molar amounts of from about 0.5:1 to 0.95:1.

8. A cure catalyst, consisting essentially of a Lewis acid which comprises
    a tri(aryl) borane; and
    a nitrogen-containing molecule, wherein the nitrogen containing molecule is one or more of 1-methyl imidazole, 2-methyl imidazole, 1-phenyl imidazole, 1,8-diazabicyclo[5,4,0]undec-7-ene (DBU), 2-ethyl-4-methylimidazole, 2,4-dimethylimidazole, butylimidazole, 2-heptadecenyl-4-methyl imidazole, 2-undecenylimidazole, 1-vinyl-2-methylimidazole, 2-phenylimidazole, 2-ethyl 4-methylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazolearyl substituted imidazole, phenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole, 1-benzyl-2-methylimidazole, 2-p-methoxystyrylimidazole, 2-phenyl-4,5-dihydroxymethylimidazole, an addition product of imidazole and trimellitic acid, 1,4-diazabicyclo[2,2,2]octane, and 1,7,10,16-tetraoxa-4,13-diazacyclooctadecane.

* * * * *